US009973193B2

United States Patent
Chan et al.

(10) Patent No.: US 9,973,193 B2
(45) Date of Patent: *May 15, 2018

(54) ENABLING A FIELD PROGRAMMABLE DEVICE ON-DEMAND

(71) Applicant: INTERNATIONAL BUSINESS MACHINES CORPORATION, Armonk, NY (US)

(72) Inventors: Yuk L. Chan, Rochester, NY (US); Andrew P. Wack, Millbrook, NY (US); Peter B. Yocom, LaGrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/495,059

(22) Filed: Apr. 24, 2017

(65) Prior Publication Data

US 2018/0083632 A1 Mar. 22, 2018

Related U.S. Application Data

(63) Continuation of application No. 15/271,720, filed on Sep. 21, 2016, now Pat. No. 9,685,956.

(51) Int. Cl.
*G06F 7/38* (2006.01)
*H03K 19/173* (2006.01)
(Continued)

(52) U.S. Cl.
CPC ......... *H03K 19/1733* (2013.01); *G11C 17/18* (2013.01); *H03K 19/1776* (2013.01); *H03K 19/17748* (2013.01)

(58) Field of Classification Search
None
See application file for complete search history.

(56) References Cited

U.S. PATENT DOCUMENTS 9,685,956 B1 * 6/2017 Chan .................. H03K 19/1733

OTHER PUBLICATIONS

List of IBM Patents or Patent Applications Treated as Related; 2017, p. 1-2.

(Continued)

*Primary Examiner* — Anh Tran
(74) *Attorney, Agent, or Firm* — Cantor Colburn LLP; William A. Kinnaman, Jr.

(57) ABSTRACT

Examples of techniques for enabling a field programmable device on demand are disclosed. In one example implementation according to aspects of the present disclosure, a method may include: determining, by a processing device, whether to enable a disabled field programmable device; responsive to determining to enable the disabled field programmable device, identifying, by the processing device, the field programmable device from a plurality of disabled FPDs; sending an authorization request to an authorization authority to request an authorization to enable the disabled field programmable device; responsive to receiving the authorization from the authorization authority, enabling the disabled field programmable device as an enabled field programmable device; loading computer readable instructions to the enabled field programmable device; and bringing the enabled field programmable device online.

20 Claims, 5 Drawing Sheets

(51) Int. Cl.
*G11C 17/18* (2006.01)
*H03K 19/177* (2006.01)

(56) References Cited

OTHER PUBLICATIONS

Yuk L. Chan, et al., "Managing Workload Distribution Among Processing Systems Based on Field Programmable Devices" U.S. Appl. No. 15/271,753, filed Sep. 21, 2016.
Yuk L. Chan, et al.,"Deploying and Utilizing a Software Library and Corresponding Field Programmable Device Binary", U.S. Appl. No. 15/271,789, filed Sep. 21, 2016.
Yuk L. Chan, et al.,"Deploying and Utilizing a Software Library and Corresponding Field Programmable Device Binary", U.S. Appl. No. 15/271,742, filed Sep. 21, 2016.
Yuk L. Chan, et al.,"Enabling a Field Programmable Device On-Demand", U.S. Appl. No. 15/271,720, filed Sep. 21, 2016.
Yuk L. Chan, et al.,"Reprogramming a Field Programmable Device On-Demand", U.S. Appl. No. 15/271,728, filed Sep. 21, 2016.
Yuk L. Chan, et al.,"Resource Sharing Management of a Field Programmable Device", U.S. Appl. No. 15/271,780, filed Sep. 21, 2016.
Yuk L. Chan, et al.,"Service Level Management of a Workload Defined Environment" U.S. Appl. No. 15/271,770, filed Sep. 21, 2016.
Yuk L. Chan, et al.,"Service Level Management of a Workload Defined Environment", U.S. Appl. No. 15/271,760, filed Sep. 21, 2016.

\* cited by examiner

ENABLING A FIELD PROGRAMMABLE DEVICE ON-DEMAND

DOMESTIC PRIORITY

This application is a continuation of U.S. patent application Ser. No. 15/271,720, entitled "ENABLING A FIELD PROGRAMMABLE DEVICE ON-DEMAND," filed Sep. 21, 2016, the disclosure of which is incorporated by reference herein in its entirety.

BACKGROUND

The present application generally relates to field programmable devices and, more particularly, to enabling a field programmable device on demand.

Special purpose processing units are gaining popularity due to their high performance. In some situations, hardware manufacturers have begun adding field-programmable device-based special purpose processing units to computing systems to improve performance and cost to run a special workload. A field-programmable device (FPD) such as a field programmable gate array (FPGA), a programmable read-only memory (PROM), or a programmable logic device (PLD) provides more flexible compared to traditional integrated circuit manufacturing by allowing updating of functionality after shipping the computing system (i.e., while the computing system is in the field). The update of functionality of an FPD is currently limited to firmware upgrades, service related tasks, or a human decision to re-purpose an FPD.

SUMMARY

According to examples of the present disclosure, techniques including methods, systems, and/or computer program products for enabling a field programmable device on demand are provided. An example method may include: determining, by a processing device, whether to enable a disabled field programmable device; responsive to determining to enable the disabled field programmable device, identifying, by the processing device, the field programmable device from a plurality of disabled FPDs; sending an authorization request to an authorization authority to request an authorization to enable the disabled field programmable device; responsive to receiving the authorization from the authorization authority, enabling the disabled field programmable device as an enabled field programmable device; loading computer readable instructions to the enabled field programmable device; and bringing the enabled field programmable device online.

Additional features and advantages are realized through the techniques of the present disclosure. Other aspects are described in detail herein and are considered a part of the disclosure. For a better understanding of the present disclosure with the advantages and the features, refer to the following description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

DETAILED DESCRIPTION

Although previous approaches utilize updating the functionality of a field-programmable device (FPD), such updating is limited. Consequently, FPDs have not been fully exploited for their dynamic capability. Various implementations are described below by referring to several examples of enabling an FPD (e.g., a field-programmable gate array (FPGA), a programmable read-only memory (PROM), or a programmable logic device (PLD)) on demand. Some computing system manufacturers ship computing systems with a disabled FPD included in the computing system. The disabled FPD may be enabled by a manual user request or by an automatic request by a software program executing on the computing system.

In some implementations, the present techniques provide improved functioning of the computing system by enabling additional system resources (i.e., additional FPDs) on demand, such as in response to high demand for resources. Additionally, the present techniques reduce system resource demands on the general processor of the computing system by enabling FPDs to perform specialized tasks (e.g., encoding/decoding of data, data encryption, data analytics, etc.). The present techniques also provide the ability to monitor and track the time that an FPD is enabled so that a user may be billed for the time. In addition, the present techniques enable increased system performance by enabling FPDs to be updated to perform different specialized tasks, thereby reducing the resource demands on the computing system's native resources (i.e., memory, general processor, etc.). These and other advantages will be apparent from the description that follows.

Figure 1A:
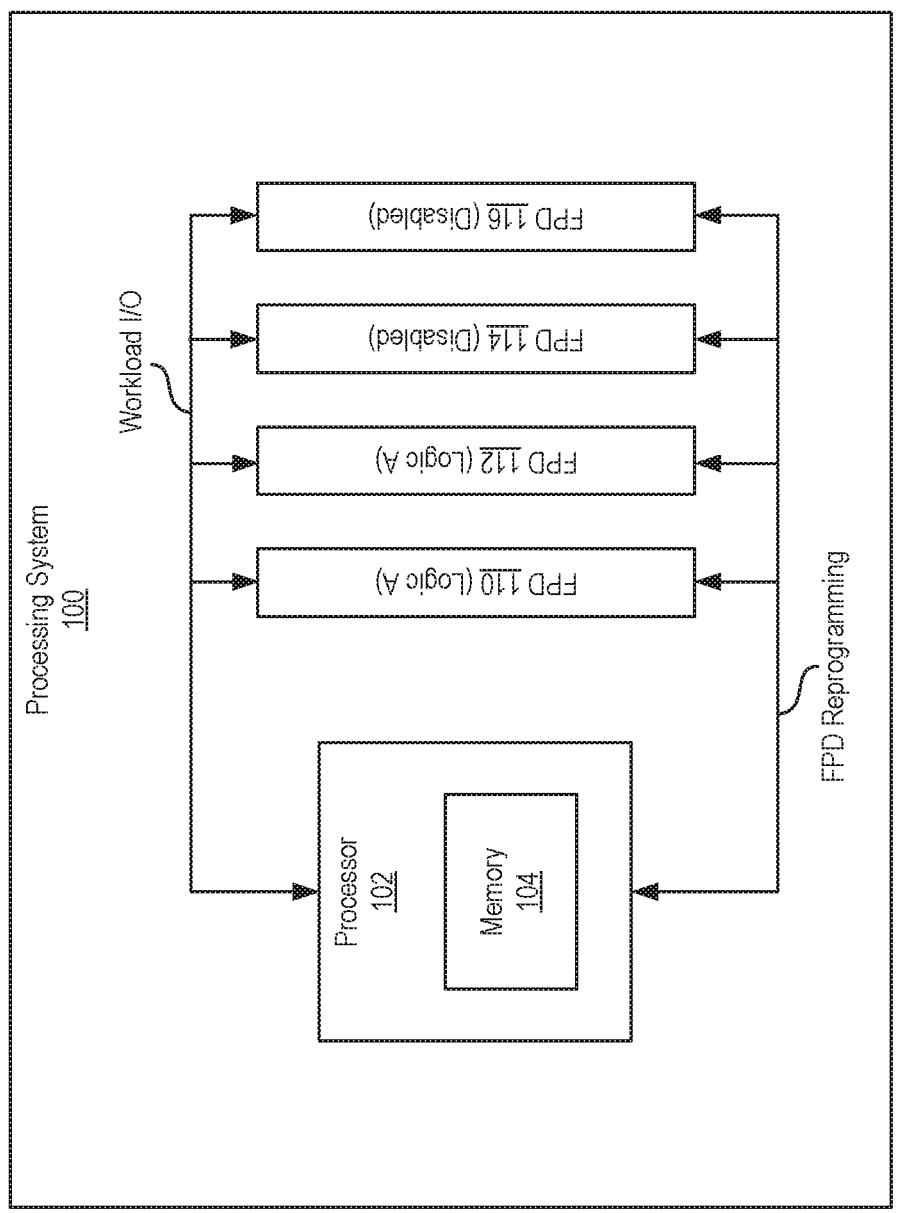
FIG. 1A and FIG. 1B illustrate a block diagram of a processing system for enabling a field programmable device on demand according to examples of the present disclosure.

FIG. 1A illustrates a block diagram of a processing system 100 for enabling a field programmable device on demand according to examples of the present disclosure. The processing system 100 includes a processor 102 that may be a general purpose processor and a memory 104 associated with the processor 102. The processor 102 is responsible for executing computer readable instructions stored in the memory 104. For example, the processor 102 may execute an operating system and one or more applications running within the operating system.

In some situations, specialized tasks may be offloaded onto a field programmable device. The FPD may execute computer readable instructions to perform a specialized task, such as encoding/decoding of data, data encryption, data analytics, or other tasks that are suitable for execution on a field programmable device. By offloading these specialized tasks to field programmable devices, the processing system 100 and its processor 102 is free to perform other tasks. A processing system can be shipped with multiple FPDs with different capabilities. These FPDs with different capabilities, manufactured by different vendors, or of different types can be used for different purposes. For example, the enablement of an FPD with different capabilities could have a different cost. FPDs with different processing throughput could mean a different cost for processing a workload using the FPD, similar to a "pay as you use software" approach. A certain FPD may have specific security features that another FPD does not include, and the workload or FPD binary can explicitly require a FPD satisfying certain security requirement.

In the example of FIG. 1A, the processing system includes four field programmable devices (e.g., FPD 110, FPD 112, FPD 114, and/or FPD 116). FPD 110 and FPD 112 are configured with Logic A, which represents logic for executing a specialized task. FPD 114 and FPD 116 are disabled (i.e., the FPDs are not configured with any logic and/or are unavailable for use by the processing system 100).

If the load on FPD 110 and FPD 112 becomes too high, one or both of FPD 114 and FPD 116 may be enabled to execute additional workloads and to reduce the burden on FPD 110 and FPD 112. The processing system 100 may identify a first FPD that is over utilized. For example, if the load on a particular FPD exceeds a threshold, the FPD may be over utilized. In one such example, a threshold may be set at 90%. If an FPD, such as FPD 110 and/or FPD 112, exceeds 90% utilization, the processing device may identify another field programmable device that is currently disabled but can be enabled. As part of the enablement processing, an FPD is selected from multiple currently disabled FPDs based on the capability requirements, available FPD binary capabilities, and other factors, and the selected FPD is reprogrammed.

In the example of FIG. 1A, FPD 114 and FPD 116 each represent FPDs that are disabled but can be enabled. The processing system 100 then sends an activation request to an authorization authority to request an authorization to enable the additional FPD (e.g., FPD 114 and/or FPD 116). The request may be sent to a user/customer of the processing system 100 indicating that the first FPD is over utilized. The request may include additional information, such as costs, associated with enabling the additional FPD. The user may elect to enable or disable the additional FPD in some examples, or the authorization may be automatic (e.g., based on a set of rules) in other examples.

Figure 1B:
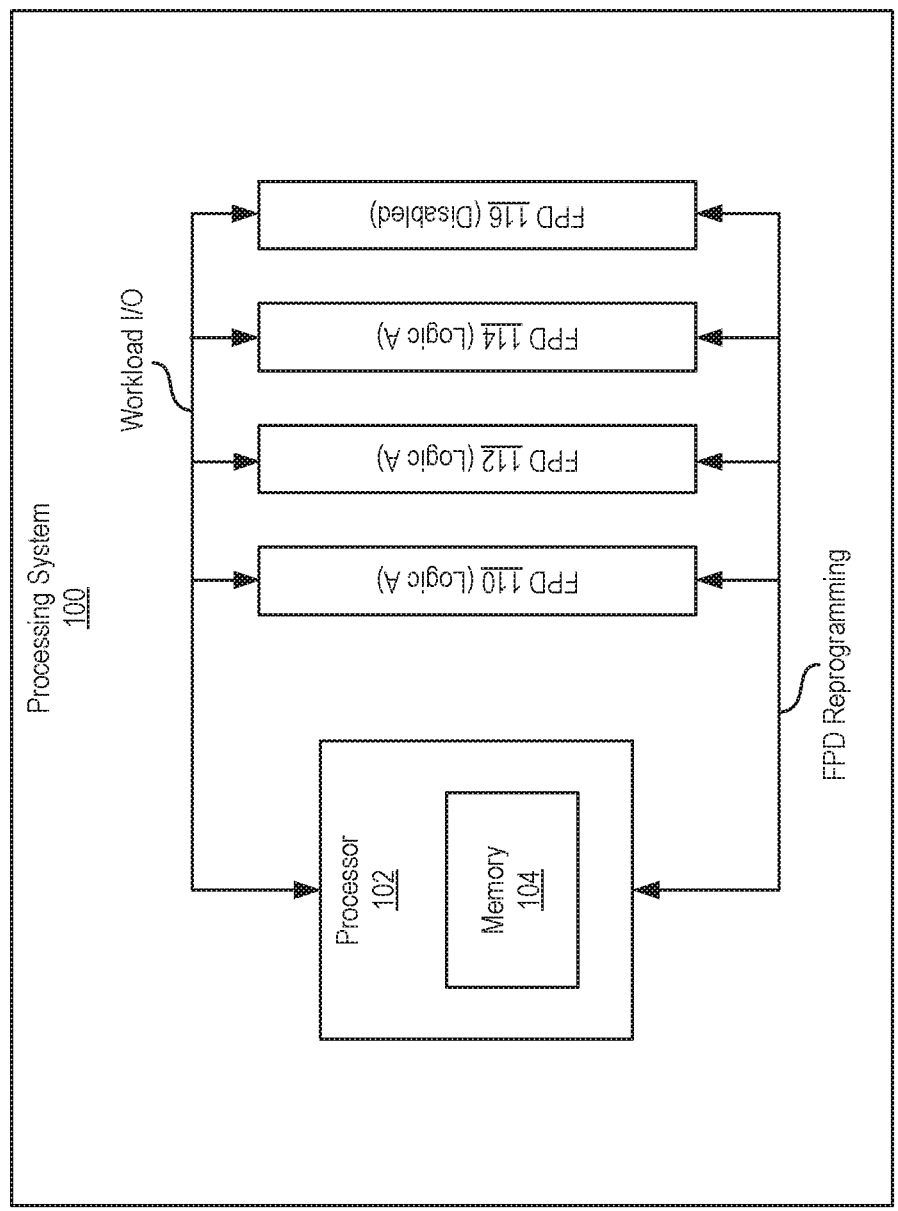

When the authorization is received from the authorization authority, the additional FPD is enabled. In the present case, FPD 114 is enabled as illustrated in FIG. 1B. Enabling the FPD may include causing the FPD to enter a programmable mode prior to loading the computer readable instructions to the second FPD. This enables the FPD to receive the computer readable instructions (i.e., logic) from the processing system 100. The newly enabled FPD 114 is then loaded with computer readable instructions (e.g., Logic A) to enable the FPD 114 to perform specialized tasks (i.e., execute a specialized workload). The FPD 114 is then brought online to begin executing a specialized workload received from the processing system 100.

Figure 2:
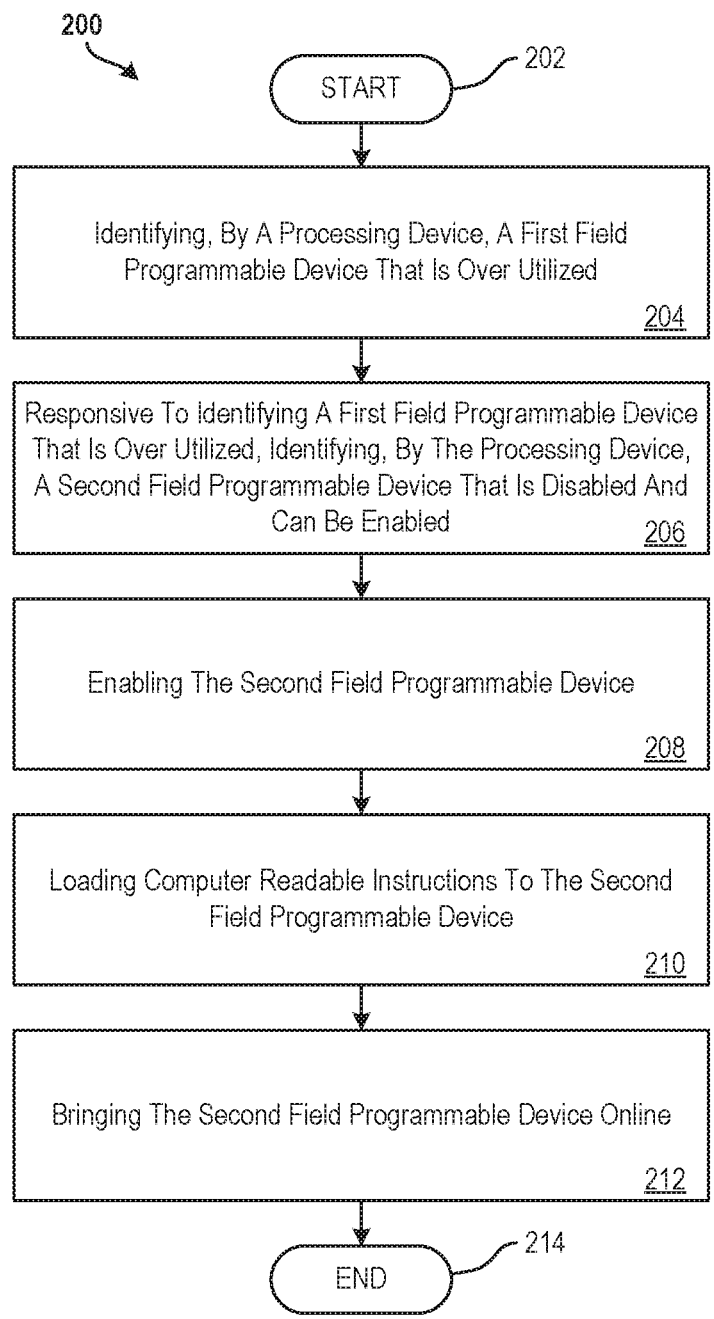
FIG. 2 illustrates a flow diagram of a method for enabling a field programmable device on demand according to examples of the present disclosure.

FIG. 2 illustrates a flow diagram of a method 200 for enabling a field programmable device on demand according to examples of the present disclosure. The method 200 may be performed, for example, by the processing system 100 of FIGS. 1A and 1B, by the processing system 20 of FIG. 4, or by another suitable processing system. It should be appreciated that, although the method 200 is described with reference to field programmable devices, it should be appreciated that the FPDs may be one of a field-programmable gate array, a programmable read-only memory, or a programmable logic device. The method 200 starts at block 202 and continues to block 204.

At block 204, the method 200 includes identifying, by a processing device, a first FPD that is over utilized. In some examples, identifying the first FPD that is over utilized includes determining that the first FPD is utilizing an amount of resources in excess of a threshold. For example, if a threshold is set to 80%, then the first FPD is considered over utilized if its resource utilization exceeds 80%.

At block 206, the method 200 includes, responsive to identifying a first FPD that is over utilized, identifying, by the processing device, a second FPD that is disabled and can be enabled. In some examples, identifying the second FPD further comprises determining that the second FPD is capable of programming with the available binary and/or executing a desired workload. For example, a particular FPD may be incapable of being configured to execute the desired workload (e.g., because of hardware restrictions, inability to receive programming updates, the disabled FPD is incompatible with the FPD binary, etc.).

It should be appreciated that, in some examples, enablement of an FPD does not have to depend on or be responsive to the first FPD being over utilized. For example, enablement of an FPD could be because a newly installed software product can use the FPD for specific purpose, because a component of a software product is over utilized and there is FPT binary that can be deployed, or because of other reasons.

At block 208, enabling the second FPD. In examples, enabling the second FPD includes receiving enablement firmware specific to the hardware and enabling the communication between the FPD and the computing hardware. In additional examples, enabling the second FPD includes receiving software or configuration upgrades to enable operating systems to detect and utilize the FPD. In yet additional examples, enabling the second FPD includes utilizing a license control program that detect an allowed FPD binary and reject a disallowed FPD binary, causing the second FPD to enter a programmable mode prior to loading the computer readable instructions to the second FPD.

In another non-limiting example, the license control program has a list of public keys for the allowed FPD binaries. Each FPD will be signed with a private key belonging to an FPD binary vendor or specific to an FPD binary. This license control program can limit the list of public keys to one or more FPDs. The license control program can be a software application installed in the operating system or in firmware. In other examples, the license control program can be a data structure containing the public keys, FPDs, and where the existing operating system or firmware can be reference during the loading of computer readable instructions to the FPD.

In another non-limiting example, a currently enabled FPD can be extended via the license control program to run another FPD binary on behalf of another workload.

At block 210, the method 200 includes loading computer readable instructions to the second FPD. The computer readable instructions cause the second FPD to execute a specialized workload received from the processing system.

At block 212, the method 200 includes bringing the second FPD online. This enables the second FPD to begin receiving the specialized workload from the processing system and executing the workload. The method continues to block 214 and ends.

Additional processes also may be included. For example, the method 200 may include executing a workload on the second FPD. The method 200 may also include disabling the second FPD. According to aspects of the present disclosure, disabling the second FPD is responsive to determining that the first FPD is utilizing an amount of resources less than a threshold. For example, when the first FPD returns to a normal workload (i.e., below the threshold), the second FPD may no longer be needed and may be disabled accordingly. In additional examples, the method 200 may include tracking, by the processing device, an amount of time the second FPD is enabled. Tracking the amount of time the second FPD is enabled allows a user/customer to be billed for the use of the additional FPD.

In some examples, the threshold to disable the second FPD is lower than the threshold to enable the second FPD. This avoids the situation where FPDs are enabled and disabled frequently due to small workload changes. Also, when the second FPD is disabled, any workload assigned to it is moved to another FPD.

An FPD can be disabled when it is no longer needed. In a non-limiting example, a workload or software having a dependency on the FPD is removed from the computing hardware or migrated to another computing hardware. In another non-limiting example, the use of an FPD no longer provides the benefits to justify the cost.

It should be understood that the processes depicted in FIG. 2 represent illustrations, and that other processes may be added or existing processes may be removed, modified, or rearranged without departing from the scope and spirit of the present disclosure.

Figure 3:
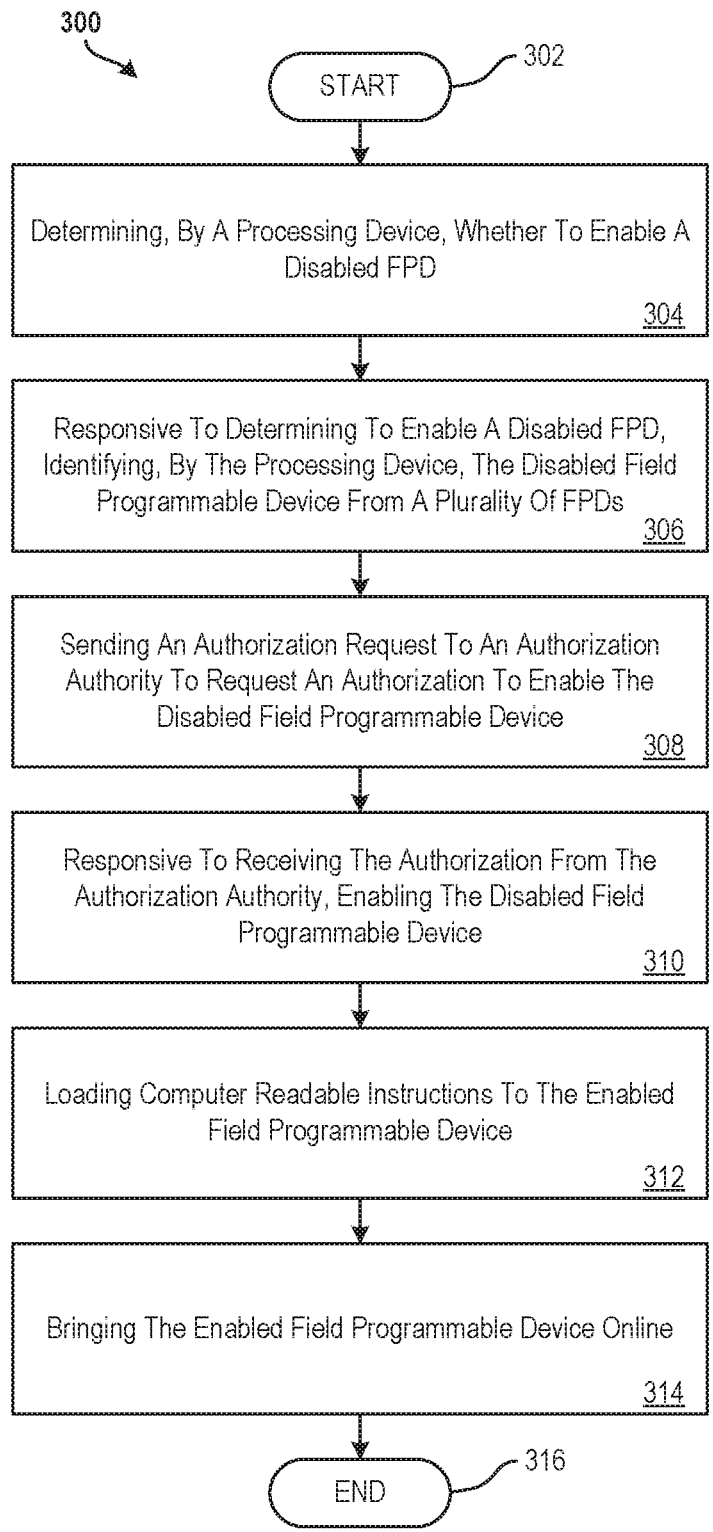
FIG. 3 illustrates a flow diagram of a method for enabling a field programmable device on demand according to examples of the present disclosure.

FIG. 3 illustrates a flow diagram of a method 300 for enabling a field programmable device on demand according to examples of the present disclosure. The method 300 may be performed, for example, by the processing system 100 of FIGS. 1A and 1B, by the processing system 20 of FIG. 4, or by another suitable processing system. It should be appreciated that, although the method 300 is described with reference to field programmable devices, it should be appreciated that the FPDs may be one of a field-programmable gate array, a programmable read-only memory, or a programmable logic device. The method 300 starts at block 302 and continues to block 304.

At block 304, the method 300 includes determining, by a processing device, whether a disabled FPD can be enabled to execute a workload. In some examples, determining to enable a disabled FPD can include identifying an over utilized FPD. An FPD may be over utilized when, for example, the FPD is utilizing an amount of resources in excess of a threshold. For example, if a threshold is set to 80%, then the first FPD is considered over utilized if its resource utilization exceeds 80%.

In another non-limiting example, determining to enable a disabled FPD can include detecting that a new software application is running on the processing system, and a depending FPD binary that is compatible with the disabled FPD is available.

In another non-limiting example, the FPD binary can be looked up from remote repositories such as a cloud, an FPD binary vendor repository, a central FPD binary authority's repository, and the like. Once a compatible FPD binary is found and verified for security requirement, a disabled FPD can be selected to be enabled.

In another non-limiting example, a system administrator planning for software upgrade can request the enablement of a disabled FPD. An appropriate FPD can be selected using the method described above, based on the specific software that the system administrator described.

At block 306, the method 300 includes, responsive to determining to enable a disabled FPD, identifying, by the processing device, the disabled FPD from a plurality of disabled FPDs. In some examples, identifying the disabled FPD further comprises determining that the disabled FPD is capable of executing a desired workload. For example, a particular FPD may be incapable of being configured to execute the desired workload (e.g., because of hardware restrictions, inability to receive programming updates, the disabled FPD is incompatible with the FPD binary, etc.).

At block 308, the method 300 includes sending an authorization request to an authorization authority to request an authorization to enable the second FPD.

At block 310, the method 300 includes, responsive to receiving the authorization from the authorization authority, enabling the second FPD. In examples, enabling the second FPD includes causing the second FPD to enter a programmable mode prior to loading the computer readable instructions to the second FPD.

At block 312, the method 300 includes loading computer readable instructions to the second FPD. The computer readable instructions cause the second FPD to execute a specialized workload received from the processing system.

At block 314, the method 300 includes bringing the second FPD online. This enables the second FPD to begin receiving the specialized workload from the processing system and executing the workload. The method continues to block 316 and ends.

Additional processes also may be included. For example, the method 300 may include executing a workload on the second FPD. The method 300 may also include disabling the second FPD. According to aspects of the present disclosure, disabling the second FPD is responsive to determining that the first FPD is utilizing an amount of resources less than a threshold. For example, when the first FPD returns to a normal workload (i.e., below the threshold), the second FPD may no longer be needed and may be disabled accordingly. In additional examples, the method 300 may include tracking, by the processing device, an amount of time the second FPD is enabled. Tracking the amount of time the second FPD is enabled allows a user/customer to be billed for the use of the additional FPD.

It should be understood that the processes depicted in FIG. 3 represent illustrations, and that other processes may be added or existing processes may be removed, modified, or rearranged without departing from the scope and spirit of the present disclosure.

Figure 4:
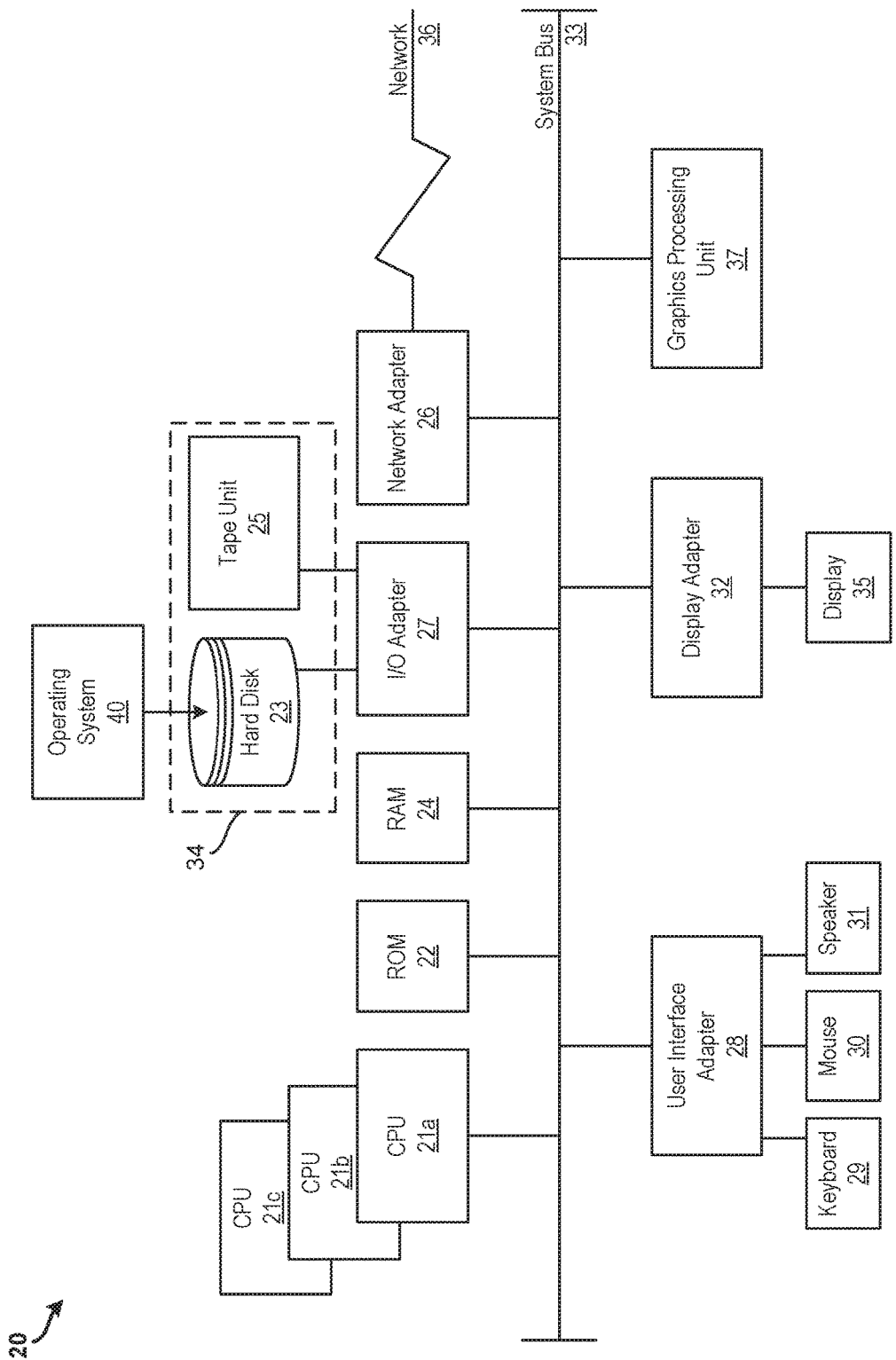
FIG. 4 illustrates a block diagram of a processing system for implementing the techniques described herein according to examples of the present disclosure.

It is understood in advance that the present disclosure is capable of being implemented in conjunction with any other type of computing environment now known or later developed. For example, FIG. 4 illustrates a block diagram of a processing system 20 for implementing the techniques described herein. In examples, processing system 20 has one or more central processing units (processors) 21a, 21b, 21c, etc. (collectively or generically referred to as processor(s) 21 and/or as processing device(s)). In aspects of the present disclosure, each processor 21 may include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and may include a basic input/output system (BIOS), which controls certain basic functions of processing system 20.

Further illustrated are an input/output (I/O) adapter 27 and a communications adapter 26 coupled to system bus 33. I/O adapter 27 may be a small computer system interface (SCSI)

adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 20 may be stored in mass storage 34. A network adapter 26 interconnects system bus 33 with an outside network 36 enabling processing system 20 to communicate with other such systems.

A display (e.g., a display monitor) 35 is connected to system bus 33 by display adaptor 32, which may include a graphics adapter to improve the performance of graphics intensive applications and a video controller. In one aspect of the present disclosure, adapters 26, 27, and/or 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 may be interconnected to system bus 33 via user interface adapter 28, which may include, for example, a Super I/O chip integrating multiple device adapters into a single integrated circuit.

In some aspects of the present disclosure, processing system 20 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing, and has a highly parallel structure that makes it more effective than general-purpose CPUs for algorithms where processing of large blocks of data is done in parallel.

Thus, as configured herein, processing system 20 includes processing capability in the form of processors 21, storage capability including system memory (e.g., RAM 24), and mass storage 34, input means such as keyboard 29 and mouse 30, and output capability including speaker 31 and display 35. In some aspects of the present disclosure, a portion of system memory (e.g., RAM 24) and mass storage 34 collectively store an operating system such as the AIX® operating system from IBM Corporation to coordinate the functions of the various components shown in processing system 20.

The present techniques may be implemented as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to aspects of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

What is claimed is:

1. A computer-implemented method for enabling a field programmable device on demand, the method comprising:
    determining, by a processing device, whether to enable a disabled field programmable device;
    responsive to receiving, from an authorization authority, an authorization to enable the disabled field programmable device, enabling the disabled field programmable device as an enabled field programmable device; and
    loading computer readable instructions to the enabled field programmable device.

2. The computer-implemented method of claim 1, further comprising, responsive to determining to enable the disabled field programmable device, identifying, by the processing device, the field programmable device from a plurality of disabled FPDs.

3. The computer-implemented method of claim 1, further comprising sending an authorization request to an authorization authority to request an authorization to enable the disabled field programmable device.

4. The computer-implemented method of claim 1, further comprising subsequent to loading computer readable instructions to the enabled field programmable device, bringing the enabled field programmable device online.

5. The computer-implemented method of claim 1, further comprising executing a workload on the enabled field programmable device.

6. The computer-implemented method of claim 1, wherein determining whether to enable a disabled field programmable device includes determining that a currently enabled field programmable device is over utilized by determining that the currently enabled field programmable device is utilizing an amount of resources in excess of a threshold.

7. The computer-implemented method of claim 1, wherein the field programmable device is one of a field-programmable gate array, a programmable read-only memory, or a programmable logic device.

8. The computer-implemented method of claim 1, wherein enabling the disabled field programmable device further comprises causing the enabled field programmable device to enter a programmable mode prior to loading the computer readable instructions to the enabled field programmable device.

9. The computer-implemented method of claim 1, further comprising disabling the enabled field programmable device.

10. The computer-implemented method of claim 9, wherein disabling the enabled field programmable device is responsive to determining that the enabled field programmable device is utilizing an amount of resources less than a threshold.

11. The computer-implemented method of claim 1, further comprising tracking, by the processing device, an amount of time the enabled field programmable device is enabled.

12. A system for enabling a field programmable device on demand, the system comprising:
    a memory having computer readable instructions; and
    a processing device for executing the computer readable instructions, the computer readable instructions comprising:
        determining, by the processing device, whether to enable a disabled field programmable device;
        responsive to receiving, from an authorization authority, an authorization to enable the disabled field programmable device, enabling the disabled field programmable device as an enabled field programmable device; and
        loading computer readable instructions to the enabled field programmable device.

13. The system of claim 12, the computer readable instructions further comprising responsive to determining to enable the disabled field programmable device, identifying, by the processing device, the field programmable device from a plurality of disabled FPDs.

14. The system of claim 12, the computer readable instructions further comprising sending an authorization request to an authorization authority to request an authorization to enable the disabled field programmable device.

15. The system of claim 12, the computer readable instructions further comprising, subsequent to loading computer readable instructions to the enabled field programmable device, bringing the enabled field programmable device online.

16. The system of claim 12, the computer readable instructions further comprising executing a workload on the enabled field programmable device.

17. The system of claim 12, wherein determining whether to enable a first field programmable device includes determining that a currently enabled field programmable device is over utilized by determining that the currently enabled field programmable device is utilizing an amount of resources in excess of a threshold.

18. The system of claim 12, wherein the field programmable device is one of a field-programmable gate array, a programmable read-only memory, or a programmable logic device.

19. The system of claim 12, wherein enabling the disabled field programmable device further comprises causing the enabled field programmable device to enter a programmable mode prior to loading the computer readable instructions to the enabled field programmable device.

20. A computer program product for enabling a field programmable device on demand, the computer program product comprising:
a computer readable storage medium having program instructions embodied therewith, the program instructions executable by a processing device to cause the processing device to:
determining, by the processing device, whether to enable a disabled field programmable device;
responsive to receiving, from an authorization authority, an authorization to enable the disabled field programmable device, enabling the disabled field programmable device as an enabled field programmable device; and
loading computer readable instructions to the enabled field programmable device.

* * * * *